(12) United States Patent
Lee et al.

(10) Patent No.: US 8,551,825 B2
(45) Date of Patent: Oct. 8, 2013

(54) METHOD FOR FABRICATING A THIN FILM TRANSISTOR WITH AN ORGANIC PASSIVATION LAYER

(75) Inventors: Bo Hyun Lee, Seoul (KR); Jae Seok Heo, Gunpo-si (KR); Woong Gi Jun, Anyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/155,972

(22) Filed: Jun. 8, 2011

(65) Prior Publication Data
US 2011/0237010 A1    Sep. 29, 2011

Related U.S. Application Data

(62) Division of application No. 11/646,718, filed on Dec. 27, 2006, now Pat. No. 7,977,676.

(30) Foreign Application Priority Data

Jun. 30, 2006    (KR) .................. 10-2006-0061430

(51) Int. Cl.
  *H01L 21/00*    (2006.01)
(52) U.S. Cl.
  USPC ........ 438/149; 438/82; 438/99; 257/E51.005; 257/E21.414
(58) Field of Classification Search
  USPC .............. 438/149, 82, 99, 40, 642; 257/59, 257/72, E51.005, E29.151, E21.26, E21.141
  See application file for complete search history.

(56) References Cited

U.S. PATENT DOCUMENTS

| | | | |
|---|---|---|---|
| 3,640,093 A | 2/1972 | Levene et al. | |
| 7,029,727 B1 | 4/2006 | Kokura et al. | |

(Continued)

FOREIGN PATENT DOCUMENTS

| | | |
|---|---|---|
| JP | 2000-241831 | 9/2000 |
| JP | 2002-189232 | 7/2002 |
| JP | 2002-202593 | 7/2002 |
| JP | 2002-311591 | 10/2002 |

OTHER PUBLICATIONS

Combined Search and Examination Report dated Mar. 16, 2007 for corresponding Great Britain Application No. GB0623876.0.

(Continued)

*Primary Examiner* — Selim Ahmed
(74) *Attorney, Agent, or Firm* — Brinks Hofer Gilson & Lione

(57) ABSTRACT

A thin film transistor (TFT) array substrate and a method for fabricating the thin film transistor (TFT) array substrate is disclosed, wherein a passivation layer is directly subjected to exposing and patterning processes without using any photoresist, thereby simplifying the fabrication process and ensuring reduced preparation costs. In particular, the method comprises a thin film transistor (TFT) array comprising: forming a gate line and a gate electrode on a substrate; forming a semiconductor layer to be insulated from the gate electrode, and overlapped with a portion of the gate electrode; forming a source electrode and a drain electrode on both sides of the semiconductor layer, respectively, while forming a data line intersecting with the gate line; forming a passivation layer over an entire upper surface of the substrate including the source electrode and the drain electrode using a sol compound of a metal alkoxide having a photosensitive group X and a silicon alkoxide having a photosensitive group Y; light-exposing and developing the passivation layer to form a contact hole through which the drain electrode is exposed; and forming a pixel electrode to be in contact with the drain electrode through the contact hole.

13 Claims, 6 Drawing Sheets

(56) References Cited

U.S. PATENT DOCUMENTS

| | | |
|---|---|---|
| 7,268,269 B2 | 9/2007 | Axtell et al. |
| 2005/0110020 A1* | 5/2005 | Hayashi et al. ............... 257/72 |
| 2005/0247472 A1 | 11/2005 | Helfer et al. |
| 2006/0141393 A1* | 6/2006 | Lee et al. ................. 430/270.1 |

OTHER PUBLICATIONS

Office Action issued in corresponding Chinese Patent Application 2006101667978; Sep. 5, 2008.

Office Action issued in corresponding Japanese Patent Application No. 2006-338218; mailed Feb. 8, 2010.

* cited by examiner

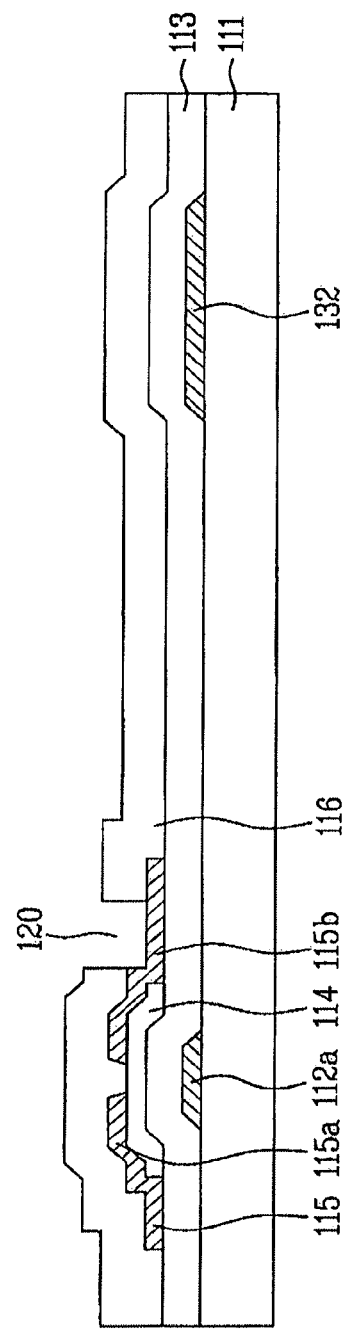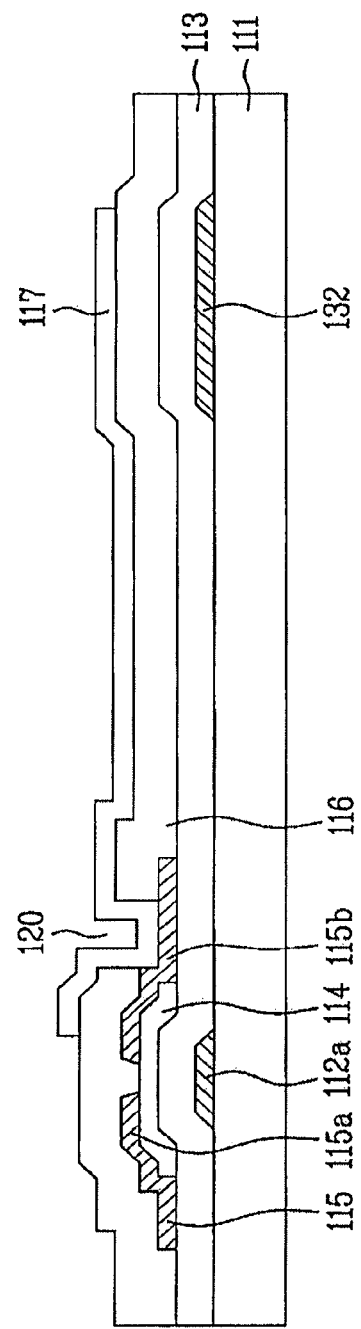

METHOD FOR FABRICATING A THIN FILM TRANSISTOR WITH AN ORGANIC PASSIVATION LAYER

The present patent document is a divisional of U.S. patent application Ser. No. 11/646,718, filed Dec. 27, 2006, which claims priority to Korean Patent Application No. 10-2006-0061430 filed in Korea on Jun. 30, 2006, which is hereby incorporated by reference.

BACKGROUND

1. Field of the Invention

The present invention relates to a liquid crystal display (LCD) device. More particularly, the present invention relates to a thin film transistor (TFT) array substrate for an LCD device and a method for fabricating the same.

2. Discussion of the Related Art

Liquid crystal display (LCD) devices have recently attracted considerable attention as flat panel display devices. A great deal of research has been conducted on the LCD devices due to their large contrast ratio and superior suitability for gray scale display or moving image display.

Since such LCD devices can have a small thickness, they are utilized in ultra-thin display devices such as wall-mounted televisions. The LCD devices are also utilized in a wide variety of applications, including display devices for notebook computers powered by batteries, private mobile communication terminals, television (TV) sets and aircraft monitors, due to their low weight and considerable small power consumption as compared to cathode-ray tube (CRT) monitors such as Brown tube monitors. For these advantages, the LCD devices have been focused as next-generation display devices.

Such an LCD device generally consists of a thin film transistor (TFT) array substrate, wherein a thin film transistor, a pixel electrode and a storage capacitor are formed on each of pixel regions defined by a gate line and a data line, a color filter layer array substrate on which a color filter layer and a common electrode are formed, and a liquid crystal layer interposed between the TFT array substrate and the color filter layer array substrate. When a voltage is applied to the electrodes, liquid crystal molecules of the liquid crystal layer are rearranged, thereby controlling the amount of light transmitted through the liquid crystal layer. Based on this principle, the LCD device displays an image.

The LCD device is formed with a variety of patterns for operating devices or lines on a substrate. For the formation of such patterns, photolithography is typically used.

The photolithography comprises: coating a photoresist material which is photosensitive to UV light, over a film layer overlying a substrate on which patterns are to be formed; soft-baking the coated photoresist at a relatively high temperature, coating an exposure mask overlying the soft-baked photoresist and exposing the photoresist to light through a pattern formed in the exposure mask; developing and patterning the exposed photoresist, and hard-baking the patterned photoresist at higher temperature; etching the film layer using the patterned photoresist as a mask, and removing the photoresist by a stripping process.

Photolithography is typically conducted 5 to 7 times for a conventional TFT array substrate to form a gate line layer, a gate insulating film, a semiconductor layer, a data line layer, a passivation layer and a pixel electrode on the substrate. An increase in the number of photolithography processes using the photoresist causes a greater chance of process errors and higher material costs. In this end, a number of studies are being made to minimize the use frequency of photolithography, and thus, to achieve an enhancement in productivity.

Hereinafter, a conventional method for forming a TFT array substrate will be described with reference to the accompanying drawings.

FIGS. 1A to 1C are sectional views illustrating a method for fabricating a conventional TFT array substrate.

With reference to FIG. 1A, a low resistance metal material is first deposited on a glass substrate 11. Photolithography is then conducted using a first exposure mask to form a plurality of gate line layers, i.e., a gate line (not shown), a gate electrode 12a and a lower storage electrode 32.

Next, an inorganic insulating material such as a silicon nitride (SiNx) or a silicon oxide (SiOx) is deposited over the entire upper surface of the glass substrate 11 including the gate electrode 12a at high temperature to form a gate insulating film 13. Consecutively, amorphous silicon is deposited on the gate insulating film 13 in such a manner to overlap the gate electrode 12a, and is subjected to photolithography using a second exposure mask, to form a semiconductor layer 14 in the form of an island.

The depositions of the gate insulating film 13 and semiconductor layer 14 are achieved by general plasma enhanced chemical vapor deposition (PECVD). Next, another low resistance metal material is deposited over the entire upper surface of the resulting structure including the semiconductor layer 14 and photolithography is conducted using a third exposure mask to form a data line 15 and a source electrode 15a and a drain electrode 15b.

The data line intersects with the gate line such that a unit pixel is defined at an intersection of the data line and gate line. Each of the source electrode 15a and a drain electrode 15b is overlapped with an edge of the semiconductor layer 14. The gate electrode 12a, the gate insulating film 13, the semiconductor layer 14 and the source electrode 15a and a drain electrode 15b are laminated together to form a thin film transistor that performs on/off operations for a voltage applied to a unit pixel. The thin film transistor is located at an intersection of the data line and gate line.

Next, an inorganic insulating material selected from the group consisting of a silicon nitride (SiNx) and a silicon oxide (SiOx) or an organic insulating material selected from the group consisting of benzocyclobutene (BCB) and acryl-based resin is deposited over the entire upper surface of the resulting structure including the data line 15 to form a passivation layer 16.

A photosensitive photoresist 19 is coated on the passivation layer 16, and then is subjected to a soft-baking process. The photoresist 19 is selectively exposed to light (e.g., UV) irradiation in a state which a fourth exposure mask 20 having a specific pattern is arranged on the photoresist 19. Next, the photoresist 19 is patterned by removing the exposed photoresist portion using a developing solution, followed by hard-baking. A portion of the passivation layer 16 exposed through the patterned photoresist is then removed to form a contact hole 20. The contact hole 20 is formed through which the drain electrode 15b is exposed.

The photoresist 19 is subjected to stripping using a stripper, after the formation of the contact hole 20 by photolithography using a stepper.

With reference to FIG. 1C, a transparent conductive material such as indium tin oxide (ITO) or indium zinc oxide (IZO) is deposited over the entire upper surface of the resulting structure including the passivation layer 16, and then is subjected to patterning by photolithography to form a pixel electrode 17 electrically connected with the drain electrode 15b through the contact hole 20. The pixel electrode 17 is formed to overlap the storage electrode 32 to form a storage capacitor. As a result, the fabrication of the TFT array substrate is completed.

However, the above-mentioned conventional TFT array substrate and the above-mentioned conventional method for fabricating the TFT array substrate have various problems as follows.

To form a contact hole in the passivation layer of the conventional TFT array substrate, various processes are required, such as photoresist coating, soft-baking, light exposure, developing, hard-baking and stripping. For this reason, the overall processes become complex, thereby causing an increase in process defects, an increase in processing time, and an increase in fabrication and material costs. As a result, a reduction in productivity occurs.

Either an inorganic insulating material or an organic insulating material may be used to form a passivation layer. However, the use of the inorganic insulating material causes a reduction in an aperture ratio of the resulting LCD device.

Specifically, when an inorganic insulating material having a high dielectric constant of 6 to 8 is used, a parasite capacitance (Cdp) disadvantageously results between a data line and a pixel electrode. The generated parasite capacitance (Cdp) induces source delay, namely, a decrease in data voltage level and vertical crosstalk, namely, a variation luminance due to the source delay. As a result, a degradation in picture quality occurs.

In an attempt to prevent generation of the Cdp, data lines and pixel electrodes are formed to be spaced apart from each other, such that they do not overlap each other. However, since the area of each pixel electrode decreases, there arises another problem of a reduction in an aperture ratio of the resulting LCD device.

Thus, to increase the aperture ratio of the LCD device, based on formation of a pixel electrode having a maximum area, it is indispensable that the pixel electrode and data line overlap each other. For this reason, a passivation layer must have a low dielectric constant. To this end, use of an organic insulating material having a low dielectric constant of 3 to 4 for forming the passivation layer has been suggested.

As is apparent from the above description, use of an organic insulating material for forming the passivation layer involves a coating method such as spin coating or slit coating other than PECVD, in contrast to the use of an inorganic insulating material. The coating methods have the advantages of simplifying the fabrication process, reducing equipment costs, and preventing occurrence of a parasite capacitance (Cdp). However, the passivation layer formed by such a coating method has an increased thickness. Thus, there is a limitation in terms of lightness.

For example, when a passivation layer is formed using an organic insulating material such as silicon nitride (SiNx) or silicon oxide (SiOx) having a dielectric constant of about 6 to about 8, the passivation layer typically has a thickness of 1500 to 5000 Å. On the other hand, when an organic insulating material such as benzocyclobutene (BCB) or acryl-based resin having a dielectric constant of about 3 to about 4 is used, the passivation layer typically has a thickness of about 3 μm.

BRIEF SUMMARY

Accordingly, the present invention is directed to a thin film transistor (TFT) array substrate and a method for fabricating the same that substantially obviate one or more problems due to limitations and disadvantages of the related art.

A thin film transistor (TFT) array is disclosed that comprises a gate line and a gate electrode overlying a substrate, a semiconductor layer insulated from the gate electrode and overlapped with a portion of the gate electrode, a source electrode and a drain electrode respectively formed on both sides of the semiconductor layer, and a data line intersecting with the gate line, a passivation layer formed over an entire upper surface of the substrate including the source electrode and the drain electrode, the passivation layer being made of a sol compound of a metal alkoxide having a photosensitive group X and a silicon alkoxide having a photosensitive group Y, and a pixel electrode being in contact with the drain electrode, wherein each of X and Y is at least one selected from the group consisting of a double bond, a triple bond, an acrylate group, an epoxy group and an oxetane group.

A thin film transistor (TFT) array comprises a gate line and a gate electrode formed on a substrate; a semiconductor layer insulated from the gate electrode and overlapped with a portion of the gate electrode; a source electrode and drain electrode respectively formed on both sides of the semiconductor layer, and a data line intersecting with the gate line; a passivation layer using a material having a structure in which nanoparticles are dispersed in a polymer matrix having a photosensitive group X and a photosensitive group Y; and a pixel electrode being in contact with the drain electrode, wherein each of X and Y are at least one selected from the group consisting of a double bond, a triple bond, an acrylate group, an epoxy group and an oxetane group.

A method for fabricating a thin film transistor (TFT) array is disclosed. The method includes forming a gate line and a gate electrode on a substrate, forming a semiconductor layer to be insulated from the gate electrode, and to be overlapped with a portion of the gate electrode, forming a source electrode and a drain electrode on both sides of the semiconductor layer, respectively, while forming a data line intersecting with the gate line, forming a passivation layer over an entire upper surface of the substrate including the source electrode and the drain electrode using a sol compound of a metal alkoxide having a photosensitive group X and a silicon alkoxide having a photosensitive group Y, light-exposing and developing the passivation layer to form a contact hole through which the drain electrode is exposed, and forming a pixel electrode to be in contact with the drain electrode through the contact hole, wherein each of X and Y is at least one selected from the group consisting of a double bond, a triple bond, an acrylate group, an epoxy group and an oxetane group.

A method for fabricating a thin film transistor (TFT) array comprises forming a gate line and a gate electrode on a substrate; forming a semiconductor layer to be insulated from the gate electrode, and overlapped with a portion of the gate electrode; forming a source electrode and a drain electrode on both sides of the semiconductor layer, while forming a data line intersecting with the gate line; forming a passivation layer over an entire upper surface of the substrate including the source electrode and the drain electrode using a material having a structure in which nanoparticles are dispersed in a polymer matrix having a photosensitive group X and a photosensitive group Y; light-exposing and developing the passivation layer to form a contact hole through which the drain electrode is exposed; and forming a pixel electrode to be in contact with the drain electrode through the contact hole, wherein each of X and Y is at least one selected from the group consisting of a double bond, a triple bond, an acrylate group, an epoxy group and an oxetane group.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 2A to 2C are sectional views illustrating a method for fabricating a TFT array substrate according to the present invention.

DETAILED DESCRIPTION OF THE DRAWINGS AND THE PRESENTLY PREFERRED EMBODIMENTS

Figure 1A:
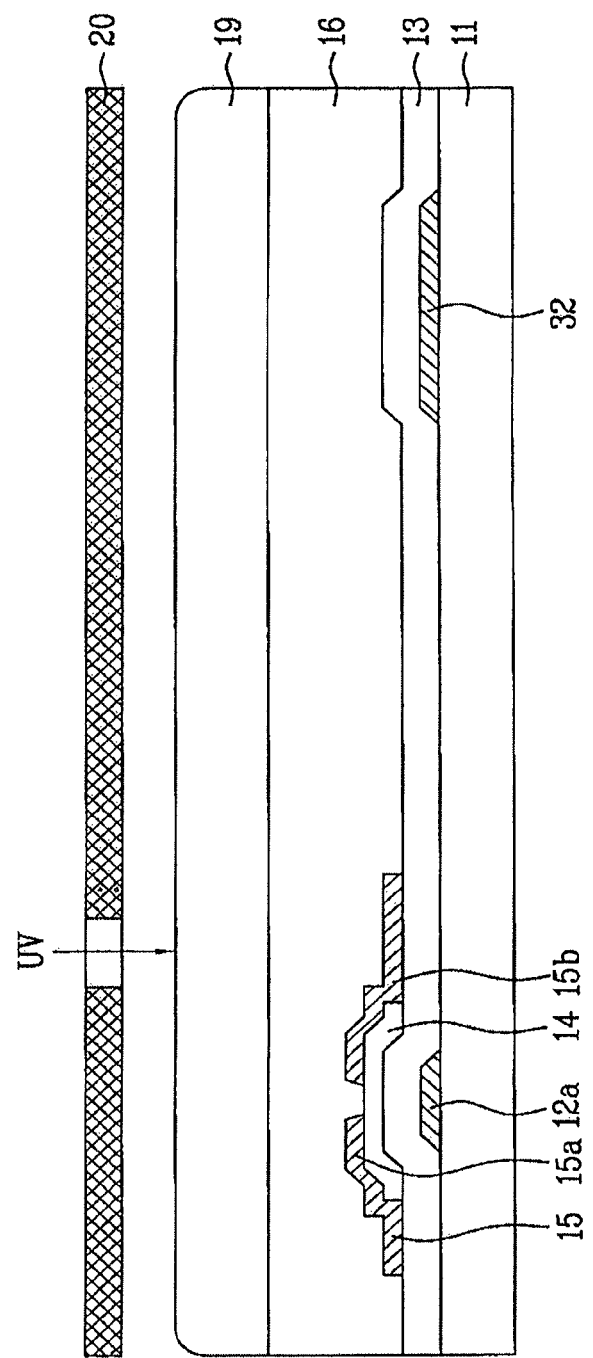
FIGS. 1A to 1C are sectional views illustrating a method for fabricating a conventional TFT array substrate.
Figure 1B:
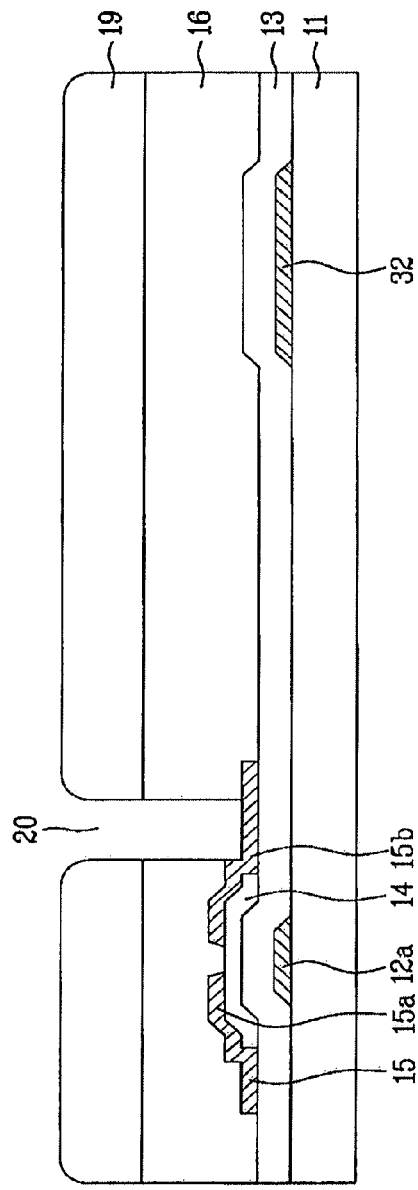
Figure 1C:
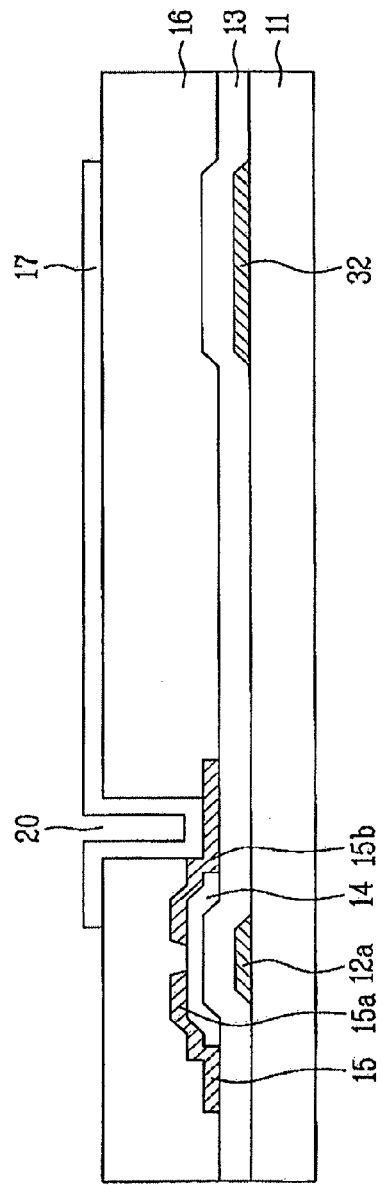
Figure 2A:
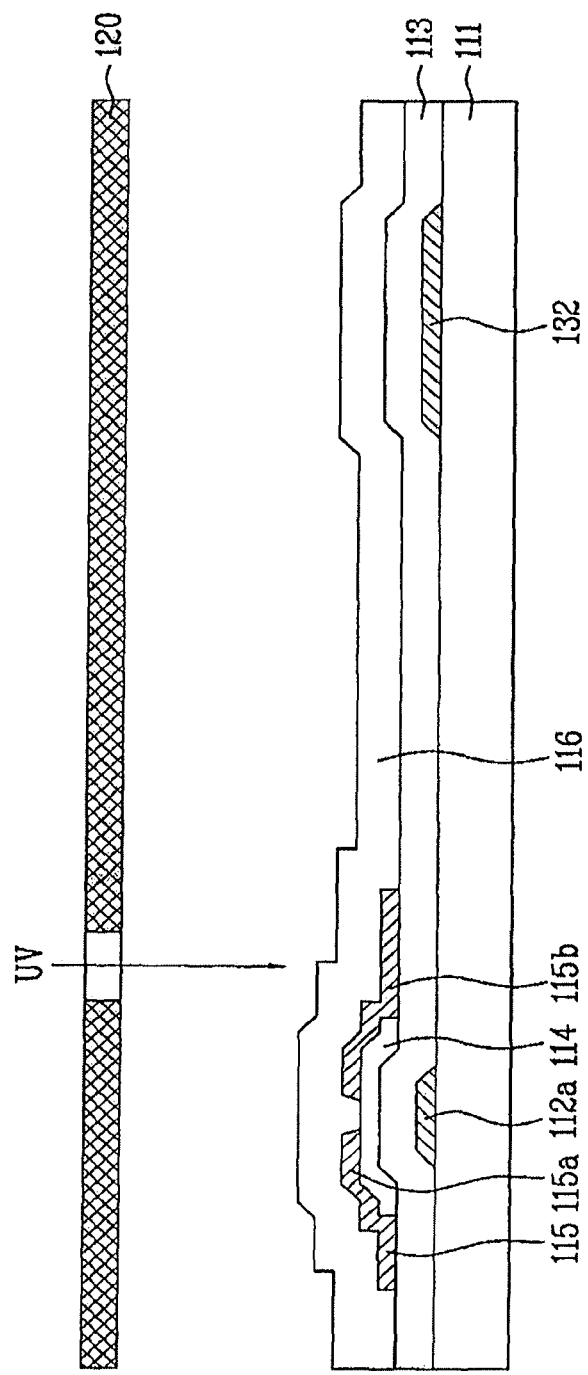
Figure 3:
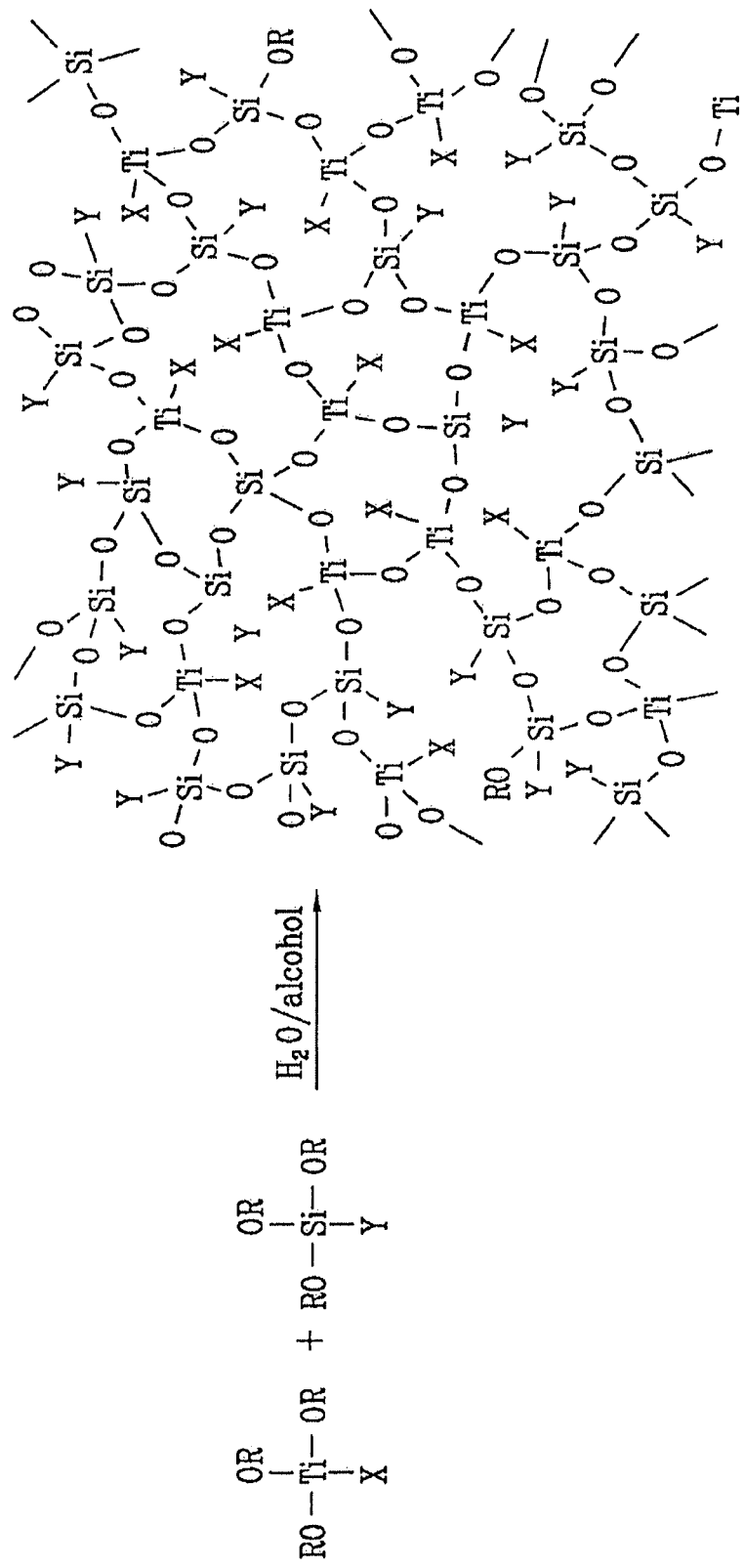
FIG. 3 is a diagram illustrating a material for a passivation layer.
Figure 4:
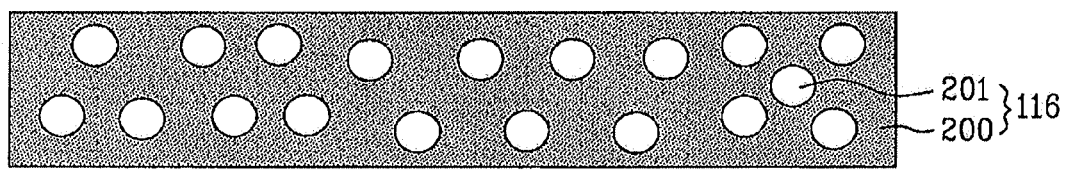
FIG. 4 is a diagram illustrating a material for a passivation layer material.

FIGS. 2A to 2C are sectional views illustrating a method for fabricating a TFT array substrate. FIG. 3 is an example diagram illustrating a material for a passivation layer. FIG. 4 is another example diagram illustrating a material for a passivation layer.

Typically, the TFT array substrate includes a gate line and a gate electrode branched from the gate line, a semiconductor layer insulated from the gate electrode by a gate insulating film and overlapped with a portion of the gate electrode, a data line intersecting with the gate line, a source electrode and a drain electrode branched from the data line respectively formed on both sides of the semiconductor layer, and a pixel electrode in contact with the drain electrode through a passivation layer. As shown in FIG. 3, a sol compound of a metal alkoxide having a photosensitive group X and a silicon alkoxide having a photosensitive group Y is used as a material for the passivation layer.

The photosensitive groups X and Y may be at least one selected from the group consisting of a double bond (e.g., 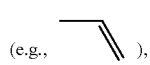 ), a triple bond (e.g., 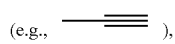 ), an acrylate group (e.g., 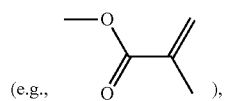 ), an epoxy group (e.g., 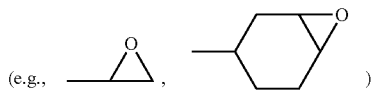 )

and an oxetane group (e.g., 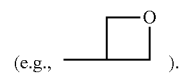 ).

The metal of the metal alkoxide may be at least one selected from the group consisting of titanium (Ti), zirconium (Zr), yttrium (Y), aluminium (Al), hafnium (Hf), calcium (Ca) and magnesium (Mg). The dielectric constant, transmittance or thermal stability of the sol compound may be changed depending on the content ratio of the silicon alkoxide to the metal alkoxide.

Alternatively, another material for the passivation layer is illustrated in FIG. 4. As shown in FIG. 4, a material having a structure in which nanoparticles 201 are dispersed in a polymer matrix 200 having a photosensitive group X and a photosensitive group Y may be used for the passivation layer. The nanoparticles 201 may be $O_2$, $AlO_3$, or MgO nanoparticles. The polymer matrix may be at least one selected from the group consisting of inorganic polymers such as polysiloxanes and polysilanes; organic polymers such as polyacrylates, polyimides and polyvinyls; and inorganic/organic hybrid polymers. The dielectric constant, transmittance or thermal stability of the passivation layer may be changed depending on the amount and kind of the nanoparticles used.

The passivation layer material may further contain a radical photo-initiator selected from benzophenones and acetophenones, or a cationic photo-initiator selected from aryldiazoniums, diaryliodoniums and triarylsulfoniums. When the passivation layer made of such a material is subjected to light exposure, the photosensitive groups X and Y are photo-crosslinked each other. The resulting photo-crosslinked portion is removed during a subsequent developing process.

As shown in FIG. 2a, a metal having a low resistivity such as copper (Cu), aluminum (Al), aluminum alloy such as aluminum-neodymium (AlNd), molybdenum (Mo), chromium (Cr), titanium (Ti), tantalum (Ta) or molybdenum-tungsten (MoW) is deposited on a substrate 111 by sputtering at high temperature. The deposited layer is subjected to a patterning process to form a gate line (not shown), a gate electrode 112a diverged from the gate line, and a storage electrode 132 arranged to be parallel to the gate line.

Then, an inorganic material such as a silicon nitride (SiNx) or a silicon oxide (SiOx) is deposited over the entire upper surface of the substrate 111 including the gate electrode 112a by plasma enhanced chemical vapor deposition (PECVD) to form a gate insulating film 113.

Subsequently, amorphous silicon (a-Si) and amorphous silicon doped with an n-type impurity (n+a-Si) are deposited on the gate insulating film 113. The deposited layers are patterned by photolithography to form a semiconductor layer 114 and an ohmic contact layer (not shown).

A metal having a low resistivity such as copper (Cu), aluminum (Al), aluminum-neodymium (AlNd), molybdenum (Mo), chromium (Cr), titanium (Ti), tantalum (Ta) or molybdenum-tungsten (MoW) is deposited over the entire upper surface of the resulting structure including the semiconductor layer 114. The deposited layer is patterned by photolithography to form a source electrode 115a and a drain electrode 115b on both sides of the semiconductor layer 114, respectively. A date line 115 is formed to be integrally connected to the source electrode 115a.

The data line intersects with the gate line such that a unit pixel is defined at an intersection of the data line and gate line. The gate electrode 112a, the gate insulating film 113, the semiconductor layer 114, the ohmic contact layer, the source 115a and drain electrode 115b constitute a thin film transistor (TFT), which is located at the intersection of the gate line and the data line. The TFT may be a top-gate type TFT whose gate electrode is located on source/drain electrodes, or an organic TFT.

Subsequently, a passivation layer 116 is formed over the entire upper surface of the resulting structure including the TFT. As described above, the passivation layer 116 may be made of a material having a chemical network structure due to a bonding between a metal alkoxide and a silicon alkoxide, or a material having a structure in which nanoparticles are dispersed in a polymer matrix. The passivation layer 116 made of such a material has not only a film passivation function, but also a photoresist (PR) function.

The formation of the passivation layer 116 using the material having a chemical network structure due to a bonding between a metal alkoxide and a silicon alkoxide will be explained in more detail. In this case, a sol compound of a metal alkoxide having a photosensitive group X and a silicon alkoxide having a photosensitive group Y is coated over the entire upper surface of the structure including the source electrode 115a and drain electrode 115b by using a printing or coating method. Soft-baking is performed at a temperature high enough to evaporate a solvent present in the sol compound, to form a passivation layer 116.

As shown in FIG. 3, the sot compound is prepared by adding $H_2O$ or alcohol to a metal alkoxide having a photosensitive group X and a silicon alkoxide having a photosensitive group Y. In this case, the metal alkoxide and the silicon alkoxide bond together to form a sol compound having a chemical network structure. As a result, the passivation layer 116 can ensure a superior thermal stability. The $H_2O$ or alcohol acts as not only a solvent but also a catalyst.

The photosensitive groups X and Y may be at least one selected from the group consisting of a double bond an epoxy group and an oxetane group The metal of the metal alkoxide may be at least one selected from the group consisting of titanium (Ti), zirconium (Zr), yttrium (Y), aluminium (Al), hafnium (Hf), calcium (Ca) and magnesium (Mg). R of the metal alkoxide and silicon alkoxide may be alkyl group (e.g., $CHC_3-$, $C_2H_5-$, $C_3H_7-$, ..., $C_nH_{2n+1}$) or phenyl group.

The dielectric constant, transmittance or thermal stability of the sol compound may be changed depending on the content ratio of the silicon alkoxide to the metal alkoxide. It is preferred that the passivation layer be made of a material having a low dielectric constant for the formation of a structure having a high aperture ratio. Thus, such a low dielectric constant may be achieved by appropriately adjusting the content ratio of the silicon alkoxide to the metal alkoxide.

Next, the formation of a passivation layer using a material having a structure in which nanoparticles are dispersed in a polymer matrix will be explained in more detail. The film material may be formed by using a printing or coating method. Soft-baking is performed at a temperature high enough for to evaporate a solvent present in the sol compound, to form a passivation layer 116.

The photosensitive groups X and Y may be at least one selected from the group consisting of a double bond

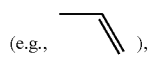

a triple bond

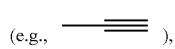

an acrylate group an epoxy group

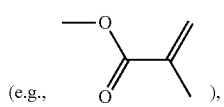

and an oxetane group (e.g., 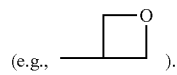 ).

The dielectric constant, transmittance or thermal stability of the passivation layer may be changed depending on the amount or kind of the nanoparticles dispersed in the polymer matrix. The nanoparticles 201 may be $O_2$, $AlO_3$, or MgO nanoparticles.

After the completion of the soft-baking, an exposure mask 120 with a predetermined pattern is coated on the soft-baked passivation layer. The coated passivation layer is exposed to ultraviolet (UV) rays or x-rays. At this time, the photosensitive groups X and Y are photo-crosslinked in accordance with the light exposure. The material for the passivation layer is directly exposed to light. The passivation layer material further contains a radical photo-initiator selected from benzophenones and acetophenones, or a cationic photo-initiator selected from aryldiazoniums, diaryliodoniums and triarylsulfoniums.

Then, the passivation layer is developed using an alkaline developing solution such as KOH or NaOH. As a result, the exposed and then photo-crosslinked part of the passivation layer is removed, as it is dissolved in the developing solution. In this case, the unexposed part of the passivation layer still remains. The developing process is achieved by using a dipping, puddling or shower spraying method.

As shown in FIG. 2B, the exposed part is removed to form a contact hole 120 through which a drain electrode 115b is exposed. After the completion of the contact hole 120, a hard-baking is carried out at a higher temperature than that of the soft-baking.

The use of direct exposing and developing processes for the formation of the contact hole on the passivation layer eliminates the need to form an additional photoresist, and thus, avoids the necessity for various processes such as photoresist coating, soft-baking, light exposure, developing, hard-baking, and stripping.

As shown in FIG. 2C, a transparent conductive material such as indium tin oxide (ITO) or indium zinc oxide (IZO) is deposited over the entire upper surface of the passivation layer 116 including the contact hole 120, and is then subjected to patterning to form a pixel electrode 117 to be electrically in contact with the drain electrode 115b. The pixel electrode 17 is formed to be overlapped with the storage electrode 132 to form a storage capacitor.

Although not shown, the TFT array substrate fabricated in accordance with the procedure is joined to an opposite substrate, such that they face each other. A liquid crystal layer is sealed in a space between the TFT array substrate and the opposite substrate. The opposite substrate includes black matrix layers for preventing leakage of light, and color filter layers formed between the adjacent black matrix layers while having color resists R, G, and B arranged in a certain order. The opposite substrate also includes an over coat layer formed on each color filter layer to protect the color filter layer and to level the surface of the color filter layer, and a common electrode formed on the over coat layer to generate an electric field together with the associated pixel electrode of the TFT array substrate.

As apparent from the above description, a TFT array substrate and a method for fabricating the TFT array substrate have the following advantages.

First, since the passivation layer has not only a film passivation function, but also a photoresist function, it is unnecessary to form an additional photoresist for patterning the passivation layer. Accordingly, there is no necessity for various processes such as photoresist coating, soft-baking, light exposure, developing, hard-baking, and stripping, thereby simplifying the fabrication process and ensuring reduced preparation and materials costs.

Second, each of photosensitivity groups X and Y constituting the passivation layer has reactivity, and thus, induces a crosslinking in the molecule. As a result, the passivation layer material ensures an enhancement in thermal stability.

Third, the insulativity, coatability, heat resistance, hardness and transmittance of the organic/inorganic materials can be readily controlled in accordance with the content ratio of silicon alkoxide to metal alkoxide. Thus, the passivation layer made of the materials is suitable for use in a liquid crystal display (LCD) device.

Fourth, the passivation layer can be formed using a printing or coating method. Accordingly, the fabrication process and the management of equipment used in the process can be simplified, as compared to the case using PECVD.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The invention claimed is:

1. A method for fabricating a thin film transistor (TFT) array, the method comprising:
    forming a gate line and a gate electrode overlying a substrate;
    forming a semiconductor layer to be insulated from the gate electrode, and to be overlapped with a portion of the gate electrode;
    forming a source electrode and a drain electrode on one side of the semiconductor layer and on the opposing side of the semiconductor layer, while forming a data line intersecting with the gate line;
    forming a passivation layer overlying an entire upper surface of the substrate including the source electrode and the drain electrode using a sol compound;
    forming a contact hole, with a photolithography process, in the passivation layer, through which the drain electrode is exposed; and
    forming a pixel electrode to be in contact with the drain electrode through the contact hole,
    wherein the sol compound includes metal alkoxide having a photosensitive group X and silicon alkoxide having a photosensitive group Y, and
    wherein each of the photosensitive groups X and Y is selected from at least one of groups consisting of an acrylate group, an epoxy group and an oxetane group.

2. The method according to claim 1, wherein the metal of the metal alkoxide is at least one selected from the group consisting of Ti, Zr, Y, Al, Hf, Ca and Mg.

3. The method according to claim 1, wherein the photosensitive groups X and Y of the sol compound are photo-crosslinked under a light-exposing process, and a photo-crosslinked portion of the sol compound is removed from the passivation layer under a developing process.

4. The method according to claim 1, wherein developing the passivation layer comprises using an alkaline developing solution.

5. The method according to claim 1, wherein at least one of a dielectric constant, a transmittance and a thermal stability of the sol compound is changed based on a content ratio of the silicon alkoxide to the metal alkoxide.

6. The method according to claim 1, wherein forming the passivation layer comprises using a printing or coating method.

7. The method array according to claim 1, wherein the sol compound further contains a radical photo-initiator selected from the group consisting of benzophenones and acetophenones, or a cationic photo-initiator selected from the group consisting of aryldiazoniums, diaryliodoniums and triarylsulfoniums.

8. A method for fabricating a thin film transistor (TFT) array, the method comprising:
   forming a gate line and a gate electrode overlying a substrate;
   forming a semiconductor layer to be insulated from the gate electrode, and overlapped with a portion of the gate electrode;
   forming a source electrode and a drain electrode on one side of the semiconductor layer and on the opposing side of the semiconductor layer, while forming a data line intersecting with the gate line;
   forming a passivation layer overlying an entire upper surface of the substrate including the source electrode and the drain electrode using a material in which nanoparticles are dispersed in a polymer matrix;
   forming a contact hole, with a photolithography process, in the passivation layer, through which the drain electrode is exposed; and
   forming a pixel electrode to be in contact with the drain electrode through the contact hole,
   wherein the polymer matrix includes photosensitive groups X and Y, and wherein each of the photosensitive groups X and Y is a triple bond group or an acrylate group, and
   wherein the nanoparticle is selected from the group consisting of O2 and AlO3 and wherein at least one of a dielectric constant, a transmittance and a thermal stability of the nanoparticles is changed based on a content ratio of silicon alkoxide to metal alkoxide of the polymer matrix.

9. The method according to claim 8, wherein the polymer matrix is selected from the group consisting of inorganic polymers including polysiloxanes and polysilanes; organic polymers including polyacrylates, polyimides and polyvinyls; and inorganic/organic hybrid polymers.

10. The method according to claim 8, wherein the photosensitive groups X and Y are photo-crosslinked under a light-exposing process, and a photo-crosslinked portion is removed from the passivation layer under a developing process.

11. The method according to claim 8, wherein developing the passivation layer comprises using an alkaline developing solution.

12. The method according to claim 8, wherein forming the passivation layer comprises using a printing or coating method.

13. The method according to claim 8, wherein the polymer matrix further comprises a radical photo-initiator selected from the group consisting of benzophenones and acetophenones, or a cationic photo-initiator selected from the group consisting of aryldiazoniums, diaryliodoniums and triarylsulfoniums.

\* \* \* \* \*